United States Patent [19]
Neugebauer et al.

[11] Patent Number: 5,864,185
[45] Date of Patent: Jan. 26, 1999

[54] SUB-SYNCHRONOUS RESONANCE FILTERS FOR SERIES CAPACITORS

[75] Inventors: Wendell Neugebauer, Ballston Spa; Stanley A. Miske, Jr., Clifton Park; Satoru Ihara, Burnt Hills, all of N.Y.

[73] Assignee: General Electric Company, New York, N.Y.

[21] Appl. No.: 630,859

[22] Filed: Mar. 28, 1996

[51] Int. Cl.[6] .................................................. H03H 7/00
[52] U.S. Cl. .......................... 307/105; 333/167; 333/172; 333/175; 333/176
[58] Field of Search ........................... 307/105; 318/629; 333/167, 172, 175, 176, 193; 363/39, 40, 47; 379/116; 327/532; 331/177; 340/578

[56] References Cited

U.S. PATENT DOCUMENTS

| | | | |
|---|---|---|---|
| 2,029,014 | 1/1936 | Bode | 333/167 |
| 2,260,494 | 10/1941 | Terroni | 307/105 |
| 2,519,455 | 8/1950 | Haantjes | 333/175 |
| 2,896,164 | 7/1959 | Bizouard | 333/175 |
| 3,518,581 | 6/1970 | Hughes | 333/167 |
| 3,555,291 | 1/1971 | Dewey | 307/105 |
| 3,745,416 | 7/1973 | Thanawala | 333/176 |
| 3,813,593 | 5/1974 | Tice | 333/175 |
| 3,881,137 | 4/1975 | Thanawala | 307/105 |
| 4,329,637 | 5/1982 | Kotake | 322/20 |
| 4,390,854 | 6/1983 | Colvin | 333/193 |
| 4,406,991 | 9/1983 | Strycula | 333/175 |
| 4,470,091 | 9/1984 | Sun | 361/20 |
| 4,551,780 | 11/1985 | Canay | 333/176 |
| 4,795,990 | 1/1989 | Ishikawa | 333/176 |
| 4,843,513 | 6/1989 | Edris | 307/105 |
| 4,864,484 | 9/1989 | Krueger et al. | 307/105 |
| 4,904,986 | 2/1990 | Pinckaers | 340/578 |
| 4,939,486 | 7/1990 | Bergdahl | 333/175 |
| 4,965,539 | 10/1990 | Korber | 333/176 |
| 5,262,677 | 11/1993 | Ramirez | 307/105 |
| 5,343,381 | 8/1994 | Bolduc et al. | 307/105 |
| 5,367,197 | 11/1994 | Klerfors | 307/105 |
| 5,565,713 | 10/1996 | Roseen | 307/105 |

*Primary Examiner*—William M. Shoop, Jr.
*Assistant Examiner*—Peter Ganjian
*Attorney, Agent, or Firm*—Carl B. Horton; Fishman, Dionne, Cantor & Colburn

[57] ABSTRACT

A passive filter device for a capacitor in series with a substantially inductive transmission line of an electric transmission system is disclosed. The passive filter device comprises a double-loop RCL filter in parallel with the series capacitor. At power frequency, the filter device allows the power frequency current to pass through the series capacitor with minimum power losses. At sub-synchronous resonance frequencies, the passive filter device provides bypassing of the series capacitor with maximum selectivity of the RCL filter.

7 Claims, 2 Drawing Sheets

SUB-SYNCHRONOUS RESONANCE FILTERS FOR SERIES CAPACITORS

FIELD OF THE INVENTION

This invention generally relates to filters for power capacitors. More specifically, this invention relates to power filters and/or dampers for capacitors in electric power systems.

BACKGROUND OF THE INVENTION

In electrical power systems, damaging oscillations known as sub-synchronous resonance (SSR) oscillations occur when energy is interchanged between a torsional system of a turbine generator and a series-compensated transmission network via a generator air gap, at one or more natural frequencies of the combined system. Since the electric utility turbine generators of these systems may be seriously damaged through SSR oscillations, several approaches have been taken to compensate for and/or filter out these damaging oscillations.

One such approach is discussed in U.S. Pat. No. 5,367,197 "Series Capacitor Equipment" by Klerfors, which is hereby incorporated by reference. Klerfors discloses an "active-type" filter wherein a controllable circuit comprising an inductor and controllable semiconductor connection is connected in parallel to the series capacitor of a series-compensated transmission network. The filter transforms the energy of the subharmonic oscillation into fundamental frequency power and returns it to the power network. Some disadvantages in using this and other active-type filters with controllable semiconductor connections are as follows: many components are usually involved; the control device that is utilized may require sophisticated detection and control means; the thyristor switching process may create undesired harmonics that lower the quality of the power supply; and finally, the cost is generally high.

Another approach of filtering out undesirable SSR oscillations in transmission lines with series capacitors is through passive filters. Two examples of passive filters are disclosed in the following U.S. Patents which are hereby incorporated by reference. U.S. Pat. No. 5,262,677, "Reactor Subsynchronous Tuning Scheme" by Ramirez discloses a passive device in combination with a line inductive shunt reactor. At synchronous frequency the device acts as a short circuit, allowing the current of this frequency to pass through, while at SSR frequencies, the device attains a selected admittance magnitude through the capacitance and shunt reactor. The disadvantages of using shunt reactors in transmission lines, though, are that various and undesirable steady-state losses are associated with each shunt reactor, and usually shunt reactors are very costly.

U.S. Pat. No. 5,343,381, "Electrical Dampening Circuit for Dampening Resonance of a Power Signal in a Power Distribution Network" by Bolduc et al. discloses a parallel filter circuit for dampening resonance of a power signal. Bolduc uses a simple RCL circuit tuned to filter out a certain range of frequencies. One disadvantage of having a simple filter circuit such as the Bolduc filter is that it is limited to dampening at that certain range of sub-synchronous frequencies, and may not filter out all of the damaging frequencies. Furthermore, losses of power at power frequency may occur.

Thus, there is a need in the art to provide a passive parallel filter that will not only produce less power losses at power frequency but will provide dampening at a wider range of sub-synchronous frequencies.

SUMMARY OF THE INVENTION

It is, therefore, an advantage of this invention to provide a passive filter for filtering out sub-synchronous resonance with minimal power loss at power frequency.

It is also an advantage of this invention to provide a passive filter arrangement that dampens at a wider range of sub-synchronous frequencies, thus providing more selectivity.

According to the present invention, a passive filter device for a capacitor in series with a substantially inductive transmission line for an electric power system is disclosed. The passive filter device comprises a double-loop RCL filter in parallel with the series capacitor. At power frequency, the filter device allows the power frequency current to pass through the series capacitor with minimum power losses. At sub-synchronous resonance frequencies, the passive filter device provides bypassing of the series capacitor with maximum selectivity of the RCL filter. The parallel circuit formed by a combination of resistive, inductive and capacitive elements (RCL) is tuned to a resonance very near the power frequency such that the filter appears to be at high impedance at that frequency with only the main capacitor strings active in compensating the transmission line impedance.

The double-loop filter is used in and disclosed in a multi-stage tuned arrangement wherein the capacitive reactance of the complete circuit is made lower in magnitude than the inductive reactance of the line over all frequencies of interest, thus greatly reducing the potential for sub-synchronous oscillations. A second embodiment of the filter device is also disclosed.

The foregoing and other objects, features and advantages of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DESCRIPTION OF THE PREFERRED EMBODIMENTS

Figure 1:
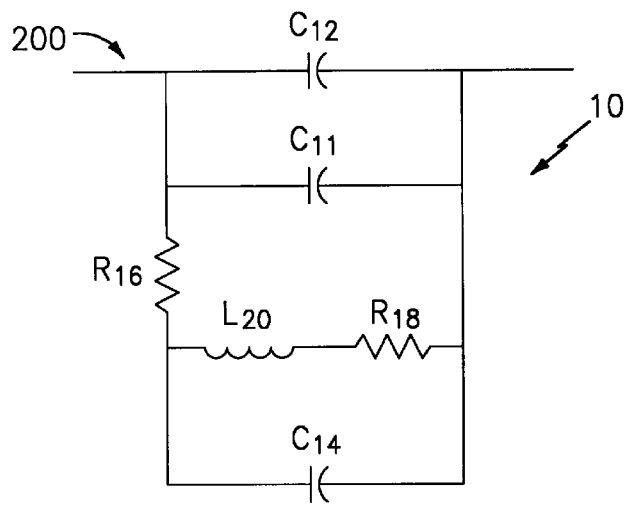
FIG. 1 is a circuit diagram of a single stage passive filter device according to an embodiment of the present invention, employing a filter circuit topology knowing the prior art.

FIG. 1 is an embodiment of the parallel filter device 10 of the present invention. The topology of this single-staged filter circuit is known in the prior art. Capacitors C11 and C12 are connected together in parallel. The combination of C11 and C12 form the main series capacitor that is used to compensate the inductive reactance of the transmission line 200. The filter associated with the capacitor group comprises resistive elements R16 and R18, an inductive element L20, and a capacitive element C14. Although resistors, inductors and capacitors are illustrated for these elements, it is to be understood that other devices and/or elements that have similar characteristics may also be used, such as a mutual inductor or a resistor incorporated into an inductor or a portion thereof. The first loop or branch of the filter device comprise the first resistive element R16 in series with the inductive element L20 and the second resistive element R18, this first loop being in parallel with C11. The second loop or branch of the filter comprise the capacitive element C14 coupled in parallel to the inductive element L20 and the second resistive element R18.

At the power frequency, the RCL filter allows a power frequency current to pass through the series capacitors C11 and C12 with minimum power losses. That is, the negligible losses that may occur will not detrimentally affect the power system and turbine generator. The parallel circuit formed by C14, L20 and R18 is tuned to a resonance very near the power frequency such that the filter appears to be a high impedance at that frequency with only the main capacitor strings C11 and C12 active in compensating the transmission line impedance. Thus, the impedance of C14 is approximately equal to the impedance of L20 at power frequency (i.e., $X_{C14} \approx X_{L20}$). At sub-synchronous resonance frequencies, the filter bypasses the series capacitor. The RCL filter of the present invention provides a dampening of a wide range of sub-synchronous frequencies through utilizing a secondary loop.

Figure 2:
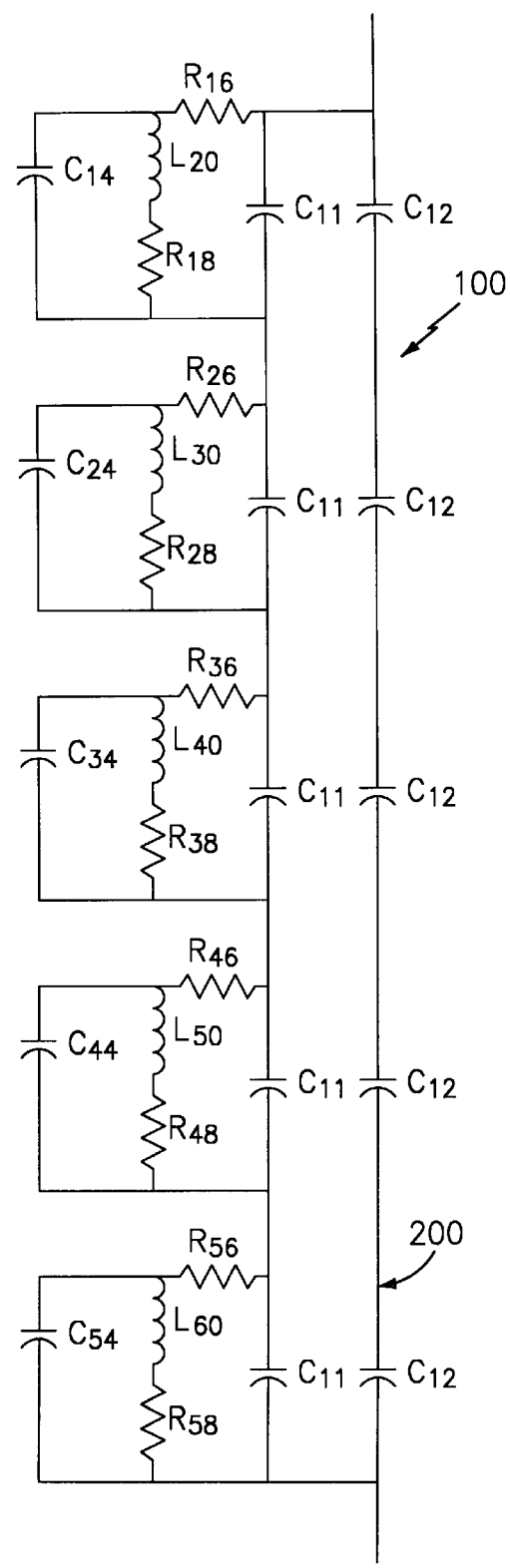
FIG. 2 is a circuit diagram of the passive filter device of FIG. 1 used within a five stage tuned filter system.

FIG. 2 depicts the elements of the single stage filter of FIG. 1 as set up in a five stage stagger-tuned filter 100. Each of the filters 10 are arranged as shown and described in reference to FIG. 1. A tuned affect is achieved by tuning the resistive and capacitive elements of each of the filters (i.e., tuning R18 and C14, R28 and C24, R38 and C34, R48 and C44 and R58 and C54) to various resonance frequencies. Again, the parallel circuit formed by the C, L and R elements is made to exhibit a resonance very near the power frequency such that the filter appears to be a high impedance at that frequency. The capacitive reactance of the complete circuit 100 can be made lower in magnitude than the inductive reactance of the line over all frequencies, thus greatly reducing the potential for sub-synchronous oscillations.

Figure 3:
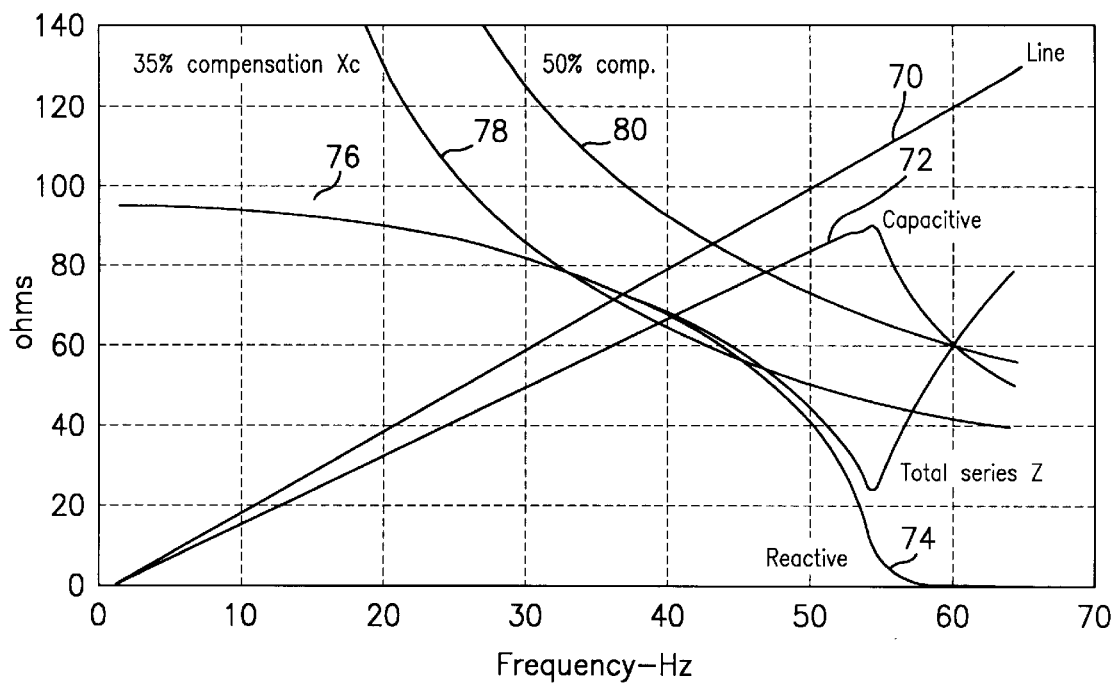
FIGS. 3 and 4 illustrate exemplary graphs for the tuned filter of FIG. 2.
Figure 4:
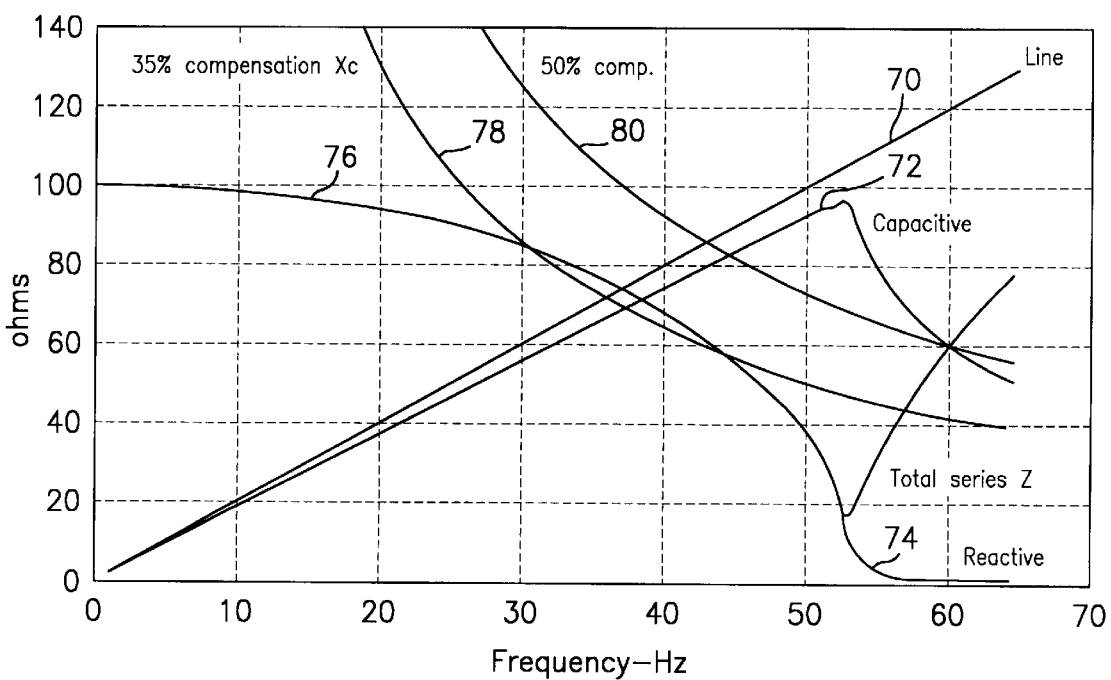

FIGS. 3 and 4 illustrate an example of the frequency response of the series capacitor C11 and filter arrangement 100 for two combinations of optimum selected parameters. In this example, a filter was designed for a series capacitor that produced a 50 percent compensation for a line having 120 ohms series magnitude of the series capacitor reactance ($X_{C11}$) 72. The line reactance 70, magnitude of the series capacitor reactance 72, and the series capacitor effective resistance 76 are shown in FIGS. 3 and 4 as functions of frequency. For illustration and comparison, the magnitudes of the capacitive reactance of a typical series capacitor without a filter device for 35 and 50 percent line compensation are also depicted (elements 78 and 80, respectively). Line 74 is he effective resistance of the filter device as illustrated in the figures (denoted as RESISTIVE).

As shown in FIGS. 3 and 4, the series capacitor reactance 72 of this example will always be lower in magnitude than the transmission reactance 70. This occurs because the tuned circuit of FIG. 2 is tuned for several different frequencies, thus the circuit will not exhibit a true series resonance at any frequency below power frequency. The total effective series impedance does exhibit a minimum, though, which can easily be increased by choosing a larger filter in terms of its reactive power (MVAr). Thus, the effective resistance of the entire series capacitor including the filter exhibits significant damping capability at sub-synchronous frequencies (such as below 53 Hz as shown in this example) with the effective range of frequencies being adjustable by the choice of filter MVAr.

Figure 5:
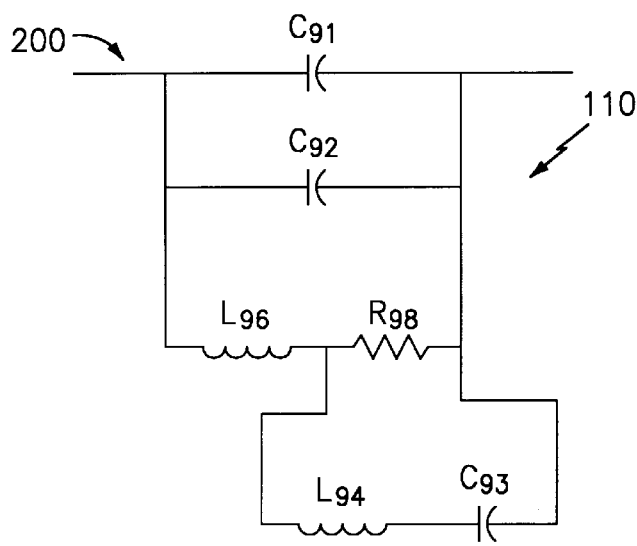
FIG. 5 is a circuit diagram of another embodiment of a single-stage filter employing a topology known in the prior art.

A second embodiment of the parallel filter device 110 of the present invention is illustrated in FIG. 5. The topology of this single-stage filter circuit is known in the prior art. Capacitor C91 forms the series capacitor that is used to compensate the inductive reactance of the transmission line 200. The filter associated with this series capacitor comprises resistive element R98, inductive elements L94 and L96, and capacitive elements C92 and C93. As aforementioned, although resistors, inductors and capacitors are illustrated for these elements, it is to be understood that other devices and/or elements that have similar characteristics may also be used, such as a mutual inductor or a resistor incorporated into an inductor or a portion thereof. The first loop of the filter device comprise the first inductive element L96 in series with the resistive element R98, this first loop being in parallel with the first capacitive element C92 and the series capacitor C91. The second loop of the filter includes the second inductive element L94 in series with the second capacitive element C93 in parallel to the resistive element R98 of said first loop.

As in the first embodiment, at power frequency the RCL filter allows a power frequency current to pass through the series capacitor C91 with minimum losses. The impedance of C92 is approximately equal to the impedance of L96 at power frequency (i.e., $X_{C92} \approx X_{L96}$). Similarly, the impedance of C93 is approximately equal to the impedance of L94 at power frequency (i.e., $X_{C93} \approx X_{L94}$) At sub-synchronous resonance frequencies, the filter bypasses the series capacitor with maximum selectivity of the RCL filter. That is, the secondary loop provides less losses at power frequency, and more damping at a wider range of sub-synchronous frequencies.

While the invention has been particularly shown and described with reference to preferred exemplary embodiments thereof, it will be understood by those skilled in the art that various changes in form and details may be made therein without departing from the spirit and scope of the invention.

We claim:

1. A passive filter device for a capacitor in series with a substantially inductive transmission line of an electric power system, said passive filter device comprising:

a double-loop RCL filter in parallel with said series capacitor for allowing current at a power frequency to pass through said series capacitor with minimum power loss at said power frequency, and or bypassing said series capacitor with maximum selectivity of said RCL filter at sub-synchronous resonance frequencies, wherein said double-loop filter includes.

2. The passive filter of claim 1 wherein the reactance of said capacitive element is lower in magnitude that the reactance of said inductive transmission line over selected frequencies.

3. A passive filter device for a capacitor in series with a substantially inductive transmission line of an electric power system, said passive filter device comprising:

a double-loop RCL filter in parallel with said series capacitor for allowing current at a power frequency, and for bypassing said series capacitor with minimum power loss at said power frequency, and for bypassing said series capacitor with maximum selectivity of said RCL filter at sub-synchronous resonance frequencies, wherein said double-loop filter includes, a first loop having a first inductive element in series with a resistive element, said first loop being in parallel with a first capacitive element and said series capacitor;

a second loop having a second inductive element in series with a second capacitive element coupled in parallel to said resistive element of said first loop.

4. A multi-stage tuned filter system having at least two capacitors in series with a substantially inductive transmission line and at least one passive filter device comprising:

a double-loop RCL filter in parallel with said series capacitor for allowing a current at power frequency to pass through said series capacitor with negligible power losses at said power frequency, and for bypassing said series capacitor with variable selectivity of said RCL filter at sub-synchronous resonance frequencies.

5. The filter system of claim 4 wherein said double loop filter comprises:

a first loop having a first resistive element in series with an inductive element and a second resistive element, said first loop being in parallel with said series capacitor;

a second loop including a capacitive element in parallel to said inductive element sand said second resistive element.

6. The filter system of claim 5 wherein the reactance of said capacitive element is lower in magnitude than the reactance of said inductive transmission line over selected frequencies.

7. The filter system of claim 4 wherein said double-loop filter comprises:

a first loop having a first inductive element in series with a resistive element, said first loop being in parallel with a first capacitive element and said series capacitor;

a second loop including a second inductive element in series with a second capacitive element in parallel to said resistive element of said first loop.

\* \* \* \* \*